United States Patent [19]

Miller

[11] Patent Number: 4,639,922

[45] Date of Patent: Jan. 27, 1987

[54] SINGLE MODE INJECTION LASER STRUCTURE

[75] Inventor: Stewart E. Miller, Middletown Township, Monmouth County, N.J.

[73] Assignee: Bell Communications Research, Inc., Livingston, N.J.

[21] Appl. No.: 655,257

[22] Filed: Sep. 28, 1984

[51] Int. Cl.[4] .............................................. H01S 3/19
[52] U.S. Cl. ...................................... 372/19; 372/32; 372/50; 372/92
[58] Field of Search ........................ 372/50, 19, 32, 92

[56] References Cited

U.S. PATENT DOCUMENTS

| Re 31,806 | 1/1985 | Scifres et al. | 372/50 |
| 4,297,652 | 10/1981 | Hayashi et al. | 372/50 |
| 4,347,612 | 8/1982 | Fekete et al. | 372/50 |

Primary Examiner—James W. Davie
Attorney, Agent, or Firm—James W. Falk; Stephen M. Gurey

[57] ABSTRACT

The present invention pertains to an injection laser which advantageously suppresses mode-partition-noise. The laser comprises a laser cavity with a gain or active material and means for providing a small amplitude wavelength selective loss. In one embodiment of the present invention the means for providing a small amplitude loss is a wavelength selective reflector.

22 Claims, 14 Drawing Figures

SINGLE MODE INJECTION LASER STRUCTURE

BACKGROUND OF THE INVENTION

This invention relates to the field of lasers and more specifically to the field of injection lasers.

Present silica-based optical fibers can be fabricated to have a loss in the 1.3-1.6 micron wavelength region which is an order of magnitude lower than the loss occurring at the 0.85 micron wavelength of present lightwave communications systems, e.g., ¼ db/km versus 2-3 db/km. Furthermore, these fibers can be fabricated to have a transmission delay distortion in the 1.3-1.6 micron wavelength region which is two orders of magnitude lower than the transmission delay distortion at 0.85 microns, e.g., 1-2 ps/km nm versus 100+ ps/km nm. Thus, the dispersion-limited transmission distance for high bit rate lightwave communications systems can be maximized by using a single-frequency, i.e., single-longitudinal-mode, injection laser generating output at the 1.55 micron wavelength where the fibers have minimum loss. For these reasons, present efforts in the development of lightwave communications systems are aimed at the wavelength region between 1.3 and 1.6 microns instead of at the wavelength region surrounding 0.85 microns.

InGaAsP injection lasers produce output in the desired 1.3-1.6 micron wavelength region. However, typical single-resonator InGaAsP injection lasers have a laser cavity length in the 250-300 micron range. This results in mode spacing between 6 and 9 Angstroms. Since the gain spectral width of InGaAsP injection lasers is approximately 250-300 Angstroms, there are more than 30 longitudinal modes under the gain spectral width of a 250 micron long laser. Thus, the gain difference between modes is small and mode discrimination between the main mode and side modes is poor in InGaAsP injection lasers.

The injection laser, like all other oscillators, is perturbed by internal random processes which cause its output to fluctuate. One example of this, known as mode-partition-noise, is the fluctuation at turn-on in the relative intensities of various laser modes while the total output power of the laser remains fixed. Mode-partition-noise is a consequence of random fluctuations in the photon densities of the various modes at the moment lasing threshold is reached. If the main mode photon density is not the largest at that instant, another mode will build up first. In a communication system employing such a laser, mode-partition-noise can combine with dispersion in the transmission medium to produce random distortion of the received signal, thereby degrading system performance. Since the distribution of mode partition fluctuations is exponential rather than Gaussian, fluctuations large enough to cause bit error to occur result in intolerably high rates. For example, the main mode intensity drop-out due to the mode partition fluctuations can be related to the error rate in the following way. If the laser is modulated with a bit rate equal to the main mode intensity drop-out duration (approximately 1 nanosecond), about half of the drop-out events will cause error in a system with high dispersion. Thus, a drop-out rate of 1 per second will cause an error rate of $10^{-9}$ at 1 Gbit/s. Furthermore, because mode partition fluctuations are a low-frequency phenomena, lasting a few nanoseconds, they cannot be reduced by averaging in high-bit-rate (1000-MB/s) systems.

Mode-partition-noise is inherent in any laser with more than one resonant mode, e.g., the typical InGaAsP injection laser described above, and can be expected to some degree in all conventional Fabry-Perot lasers. However, the mode-partition-noise impairment does not exist when an ideal single-longitudinal-mode (SLM) laser is used, because all the power produced by the SLM laser exists in only one mode. However, in practice, there are always unwanted vestigial side modes in any laser and SLM lasers can only be approximate.

Several structures, aimed at providing single-frequency operation, have been proposed and demonstrated. These include distributed feedback (DFB) and distributed Bragg reflector (DBR) lasers, lasers with an external cavity, injection-locking lasers, short-cavity lasers and coupled-cavity lasers. Unfortunately, these laser structures are either difficult to fabricate, difficult to operate or require external elements which are sensitive to mechanical vibration.

SUMMARY OF THE INVENTION

Advantageously, the present invention substantially eliminates mode-partition-noise in injection lasers by preferentially suppressing laser action in modes other than the main longitudinal mode of the laser cavity.

An injection laser fabricated in accordance with the teachings of the present invention comprises a laser cavity with a gain or active material and means for providing small amplitude wavelength selective loss. In one embodiment of the present invention, the means for providing small amplitude loss is a wavelength selective reflector having a value of reflectivity at the wavelength of the main mode that is less than 10% higher than its reflectivity values at the wavelengths of modes other than the main mode.

In further embodiments of the present invention, the loss is provided by selectively coupling energy out of the active material. In a first structure, the selective coupling is provided by lightwave coupling between the active material and an active waveguide having lossy terminations; in a second structure, the selective coupling is provided by lightwave coupling between a portion of the active material and a portion of an active waveguide, both the active material and the active waveguide having a lossy termination; and in a third structure, the selective coupling is provided by lightwave coupling between a waveguide comprising the active material, a passive section and a lossy termination and a passive waveguide having a lossy termination.

BRIEF DESCRIPTION OF THE DRAWING

A complete understanding of the present invention may be gained from a consideration of the following detailed description taken in conjunction with the accompanying drawing, in which.

To facilitate understanding, identical reference numerals are used to designate identical elements common to the figures.

DETAILED DESCRIPTION

Figure 1:
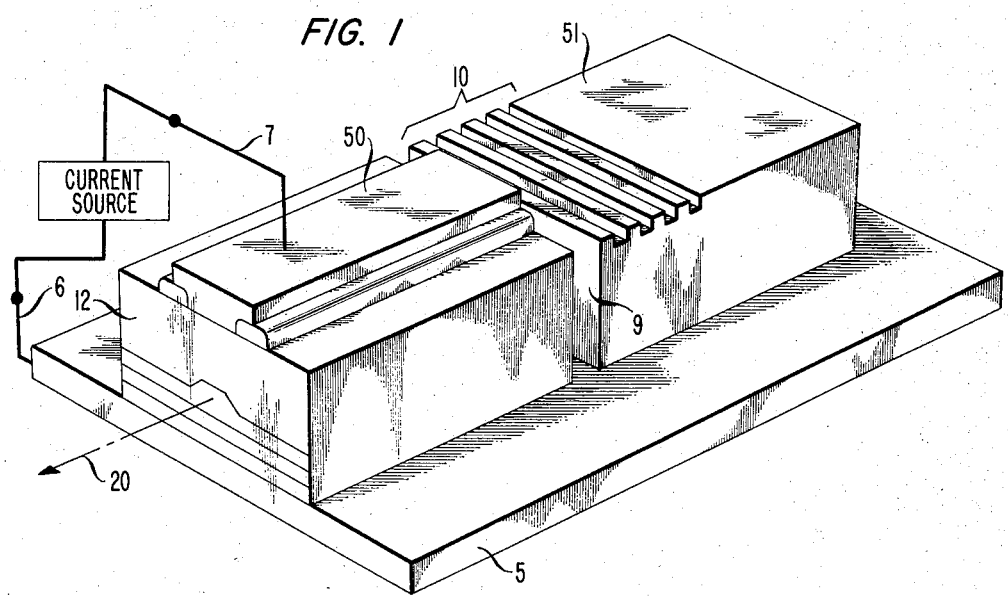
FIG. 1 shows, in pictorial form, an embodiment of the present invention in which a grating is used to provide wavelength selective loss.

Embodiments of the present invention comprise injection lasers having means for providing wavelength selective loss. The loss is greater at the wavelength of the side modes as compared to that at the wavelength of the main mode. More importantly, I have discovered, contrary to the present understanding in the art, that very small loss differences can have a dramatic effect in reducing side mode levels and thereby reducing fluctuations which cause mode-partition-noise.

Previous workers in this field have not been aware of the surprisingly large effect such small loss-differentials can have. For example, the equilibrium side mode level in a 500 micron long simple Fabry-Perot laser is about 8.5 to 1 at the 1.6 mW power level when both facet reflectivities are 0.3. This side mode level is raised to 139 to 1 by increasing the reflectivity at one end of the laser cavity to 0.31 at the main mode wavelength. Table 1 shows the results of further calculations, considering 17 total modes, for a structure having a cavity length of 500 microns and being pumped with a current density, J, equal to 1.03 ka/cm$^2$.

TABLE 1

| Main Mode Reflectivity | Side Mode Reflectivity | Main Mode to Side Mode | Main Mode Power Output (mW) |
|---|---|---|---|
| .30 | .30 | 8.5 | 1.418 |
| .31 | .30 | 139 | 1.845 |
| .32 | .30 | 270 | 1.904 |
| .35 | .30 | 658 | 1.987 |
| .40 | .30 | 1286 | 2.124 |
| .90 | .30 | 6621 | 2.783 |

As the table readily shows, main mode output increases sharply for reflectivity differences of less than 10% between the main mode and the side modes. In particular, a small increase in main mode reflectivity from 0.30 to 0.31 increases main mode output from 1/418 mW to 1.845 mW. This represents a transfer of laser output from side modes to the main mode.

This transfer has further advantages. First, embodiments of the present invention reduce laser output fluctuations when operating in a continuous mode, i.e., constant injection current. This reduces mode-partition-noise in lightwave communications systems using fibers having wavelength dispersion.

Second, embodiments of the present invention also improve the laser transient response to the leading edge of pulses in a pulse code modulation (PCM) system. Specifically, as the current density, J, in an injection laser is increased to its value at threshold, a ringing occurs in the output which results from an oscillatory interaction between photon density and carrier density. The mean of the oscillatory output at turn-on grows with an exponential-like waveform. I have discovered that a small wavelength selective loss dramatically reduces the turn-on-time, i.e., the time for the laser output to reach steady state in the main mode. For example, in the case of a 500 micron laser, the turn-on time can be reduced by a factor of ten, i.e., from 10 nanoseconds to less than one nanosecond, for a mere 2% change in reflectance. As a result, a lightwave communications system employing a laser embodying the principles of the present invention can advantageously permit the speed of the transmitted pulse stream to be increased by a factor of ten.

Specifically, embodiments of the present invention comprise an active material disposed in a laser cavity and means for providing wavelength selective loss. The loss element can be a separate structure that is appended to the active material. Furthermore, one laser can provide a multiplicity of output wavelengths while using the same active material. In this instance, the response of the wavelength selective loss element must be changed in order to suppress the unwanted wavelengths—either electrically, through an effect such as the electro-optical effect, acoustically, through the acousto-optic effect or physically, through appending a different element to the device.

FIG. 1 shows an embodiment of the present invention where reflection grating 10 provides small amplitude wavelength selective loss by means of wavelength selective reflections. Active laser section 50 is known in the art as a ridge-type laser structure. As shown, it has simple cleaved ends and smooth internal layers. The laser output from the structure is transmitted along the direction shown by arrow 20. Layer 5 is a heat sink. Contacts 6 and 7 serve as electrical contacts for applying injection current to active laser section 50. Gap 9 between the end of active laser section 50 and the beginning of reflector 51 can be non-existent, i.e., the two structures may be butted together. Reflector 51, containing reflection grating 10, can be fabricated separately from active laser section 50. Reflector 51 may be fabricated from a number of different materials. For example, reflector 51 can be a LiNbO$_3$ layer. When reflector 51 is fabricated from LiNbo$_3$, metallic contacts may be deposited thereon in order to apply a voltage therebetween and create an electric field in the reflector. This field, in turn, permits the index of refraction to be varied by means of the electro-optic effect. Alternatively, reflector 51 can be a fused silica layer. Such a layer has a low temperature coefficient and thereby provides enhanced stability of the structure. Since the reflection vs. wavelength pattern of the grating depends on the index of refraction of the material, stabilization of the index of refraction stabilizes the oscillation frequency of the laser.

Although active laser section 50 is shown as a ridge-type laser, any other laser type could be used. The active laser section merely supplies gain over the total line width of the semiconductor used. The frequency of operation, within that line width, is then selected, varied and stabilized in accordance with the properties of reflector 51.

Laser output face 12 may be a simple cleaved facet. Alternatively, it may be coated to decrease its reflection coefficient. A moderate decrease or increase in reflectivity could be used to optimize the laser output power. An accurate antireflection coating could alternatively be used to produce a superluminescent diode wherein the spectral width and peak transmission wavelength are both determined by the characteristics of reflector 51.

Another embodiment of the present invention, not shown in the drawings, is obtained when a series of layers of material having alternating value of index of refraction is substituted for reflector 51 in the embodiment shown in FIG. 1. The values of the indexes of refraction are chosen to give a reflection peak at one wavelength. The fabrication of multilayer coatings for forming laser mirrors is well known in the art. Usually, in the art, a very large ratio of peak to side level reflectance is required, but embodiments of the present invention utilize my discovery that substantial advantage may be obtained from small differences in reflectivity. Although the multilayer reflector needs as sharp a reflectance peak as can be conveniently produced to suppress side modes in a long laser, it need not have large peak-to-side mode reflectance values.

Figure 2:
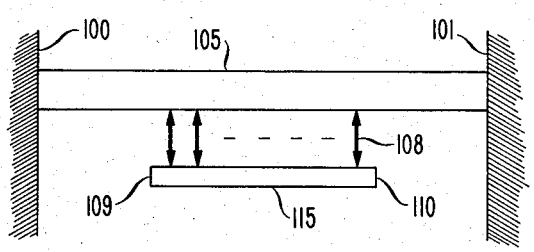
FIG. 2 shows, in pictorial form, a general structure of various embodiments of the present invention in which lightwave coupling between an active laser waveguide section and an auxiliary light guiding section is used to provide wavelength selective loss.
Figure 3:
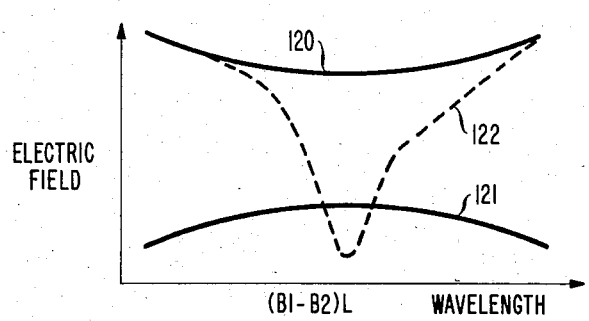
FIG. 3 shows, in graphical form, the lightwave coupling between the active laser waveguide section and the auxiliary light guiding section of FIG. 2 as a function of wavelength.

Further embodiments of the present invention are obtained by utilizing alternative structures to obtain wavelength selective loss. As discussed hereinabove, the selectivity need only to be on the order of a few percent at the wavelengths corresponding to the longitudinal mode spacing to provide advantageous results. FIG. 2 shows the general structure of various embodiments of the present invention using a novel means to provide wavelength selective loss. For sake of clarity, only those parts of the structure are shown which enable one skilled in the art to understand the operation of the embodiment. In particular, FIG. 2 shows a view looking down at the top of the injection laser structure. Active laser waveguide section 105 is disposed between broadband mirrors 100 and 101. Mirrors 100 and 101 form a laser cavity. As indicated by arrows 108, active waveguide section 105 and auxiliary light guiding section 115 are situated so that light is continuously coupled from active waveguide section 105 to auxiliary light guiding section 115. The coupling between these sections causes notable transfer of power therebetween. If the phase constants of the two sections differ, the power transfer is wavelength selective. Furthermore, by making the gain of auxiliary light guiding section 115 greater than the gain of active laser waveguide section 105, the effect can be enhanced. This is shown symbolically in FIG. 3. Here, curve 120 represents the field in section 105 and curve 121 represents the field in section 115 when there is equal gain between the two sections. Dotted curve 122 represents the field in section 105 when there is larger gain in section 115. With larger gain in auxiliary light guiding section 115 than in active laser waveguide section 105, waves coupled over to auxiliary light guiding section 115 are amplified faster than waves in active laser waveguide section 105. Thus, waves subsequently coupled out of auxiliary light guiding section 115 and back into active laser waveguide section 105, out of phase with waves in active laser waveguide section 105, do a more effective job of canceling out lasing section waves than if the gain in auxiliary light guiding section 115 was lower.

A larger gain in auxiliary light guiding section 115 can advantageously be obtained by pumping this section with a larger current density than that used to pump active laser waveguide section 105. The dimensions of the two waveguides, i.e., sections 105 and 115, are chosen to obtain the desired phase constant difference between them. In FIG. 2, ends 109 and 110 of auxiliary light guide section 115 are terminated in lossy absorbing regions. Hence, the photon density does not build up in auxiliary light guide section 115 to the same extent it does in active laser waveguide section 105, even for the same current density. Thus, high gain in auxiliary light guiding section 115 can be advantageously obtained without using a higher current density.

In a further embodiment of the present invention the coupling between active laser waveguide section 105 and auxiliary light guiding section 115 need not be continuous, as shown in FIG. 2. As such, this coupling can be discontinuous and only occur near the ends of auxiliary light guiding section 115.

Figure 4:
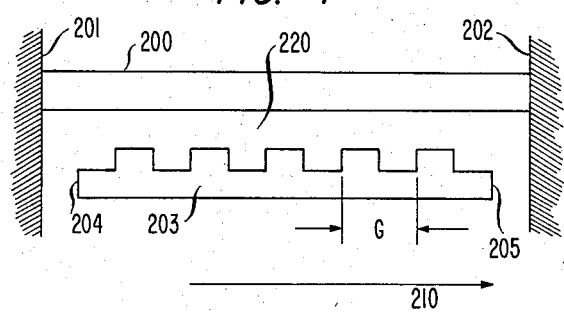
FIG. 4 shows, in pictorial form, an embodiment of the present invention, constructed in accordance with the general structure shown in FIG. 2, in which periodic coupling between the active laser waveguide section and the auxiliary light guiding section is used to provide wavelength selective loss.
Figure 5:
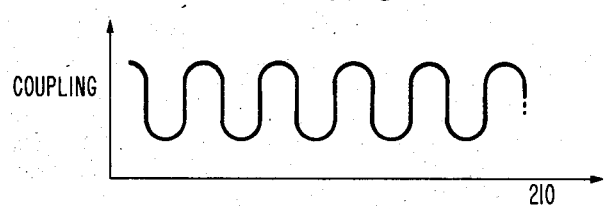
FIG. 5 shows, in graphical form, the periodic coupling provided by the embodiment shown in FIG. 4.

FIG. 4 shows an embodiment of the present invention in accordance with the general structure shown in FIG. 2. For sake of clarity, only those parts of the structure are shown which are necessary to enable one skilled in the art to understand the operation of the embodiment. Specifically, FIG. 4 shows a view looking down at the top of the injection laser structure. Active laser waveguide section 200 is disposed between broadband mirrors 201 and 202. Mirrors 201 and 202 form a laser cavity. Active laser waveguide section 200 and auxiliary light guiding section 203 are fabricated from semiconductor materials and are situated so that light couples between them. Gap 220 between active laser waveguide section 200 and auxiliary light guiding section 203 is filled with air or SiN$_2$. In either case, the coupling strength between the waveguides is greater where the width of the gap is smallest since the indexes of refraction of the semiconductor waveguides are larger than that of either air or SiN$_2$. In this embodiment, the phase constant, B1 and B2, of the waveguides are unequal and are no required to change with wavelength. The coupling strength between the waveguides periodically varies along the direction shown by arrow 210 in the manner shown by curve 211 in FIG. 5. This periodic variation is created by the periodic variation of auxiliary light guiding section 203. The period of the variation of auxiliary light guiding section 203 is G, as shown in FIG. 4. At wavelengths where G is related to the B1 and B2 of the waveguides by $G=2\pi/(B1-B2)$, the effective loss in the laser cavity is minimized. Auxiliary light guiding section 203 has lossy terminations 204 and 205.

Figure 6:
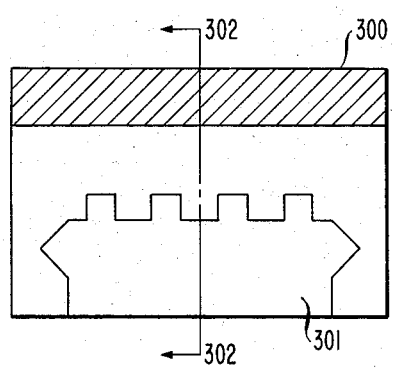
FIG. 6 shows, in pictorial form, the top view of a specific structure for the embodiment of the present invention shown in FIG. 4.
Figure 7:
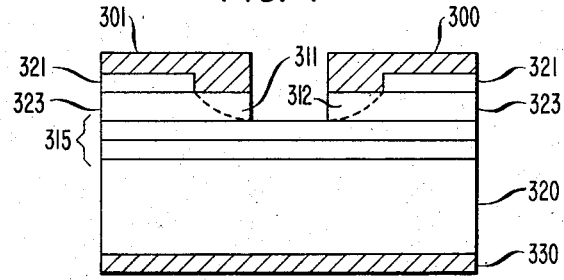
FIG. 7 shows, in pictorial form, a cross section of the structure shown in FIG. 6 and taken along the direction shown by arrows 302.

FIG. 6 shows a top view and FIG. 7 shows a vertical slice along the direction shown by arrows 302 of an injection laser structure having the periodic variation in auxiliary light guiding section 203, as described above. Metal contacts 300 and 301 and bottom electrode 330 are all used to separately pump the active laser waveguide section and the auxiliary light guiding section, respectively. Layers 315, grown on substrate 320, are n-type active and confining layers well known in the art. Layer 323 is a p-type confining layer well known in the art and layer 321 is an $SiN_2$ insulating layer. Regions 311 and 312 are Zn-diffused regions in p-type layer 323 ($SiN_2$ layer 321 also acts as a diffusion mask). FIG. 6 merely shows one of many different ways of fabricating a laser having a periodic variation in its light guiding structure. For example other structures may be fabricated where ion implantation is used instead of the $SiN_2$ insulation layer to confine current injection to the desired strips. Further, ion milling or selective chemical etching with masks can be used to form the periodic waveguide pattern.

Figure 8:
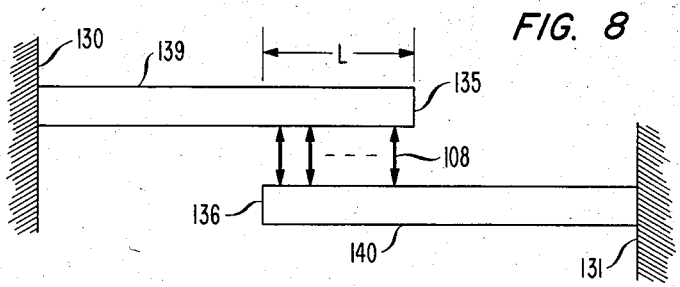
FIG. 8 shows, in pictorial form, the general structure of embodiments of the present invention in which coupling between a portion of the active laser waveguide section and an active portion of the auxiliary light guiding section is used to provide wavelength selective loss.
Figure 9:
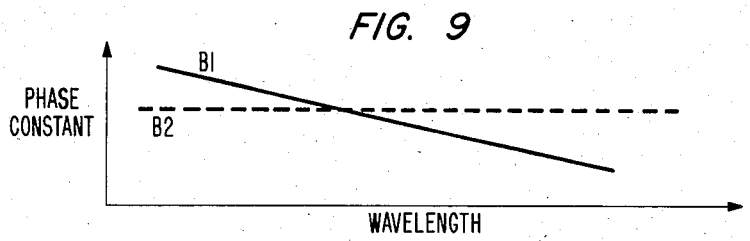
FIG. 9 shows, in graphical form, the relation between the phase constants of the active laser waveguide section and the auxiliary light guiding section for the embodiment shown in FIG. 8.

FIG. 8 shows the general structure of various embodiments of the present invention in which coupling between active portions of transmission lines 139 and 140—having lossy terminations 135 and 136, respectively—provides wavelength selective loss. Here too, for sake of clarity, only sufficient detail is shown to enable one skilled in the art to understand the operation of the embodiment. Specifically, FIG. 8 shows a view looking down at the top of the injection laser structure. Current is injected into each transmission line along its entire length. Mirrors 130 and 131 are broadband mirrors and form a laser cavity. Transmission lines 139 and 140 are fabricated to have phase constants which are equal at one wavelength and unequal at all others by using materials having different indexes of refraction and forming transmission line structures having different transverse dimension. The resulting wavelength dependent phase constants are graphically shown in FIG. 9.

The relatively broadband coupling between transmission lines 139 and 140 causes appreciable power transfer at the main mode wavelength, but little net power transfer at other wavelengths. In accordance with the present invention, there need not be a complete transfer of power between transmission lines 139 and 140 in order to obtain single mode behavior.

Figure 10:
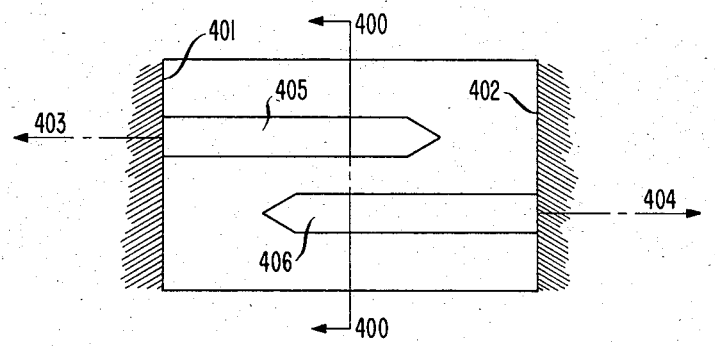
FIG. 10 shows, in pictorial form, the top view of a specific structure for the embodiment of the present invention shown in FIG. 8.
Figure 11:
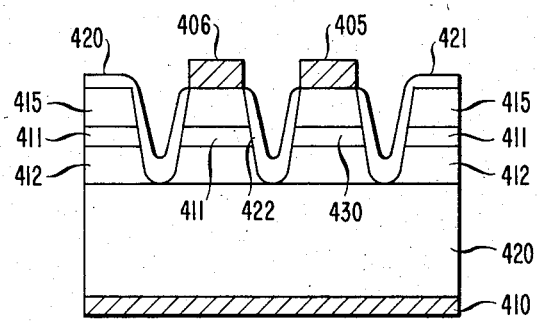
FIG. 11 shows, in pictorial form, a cross section of the structure shown in FIG. 10.
Figure 12:
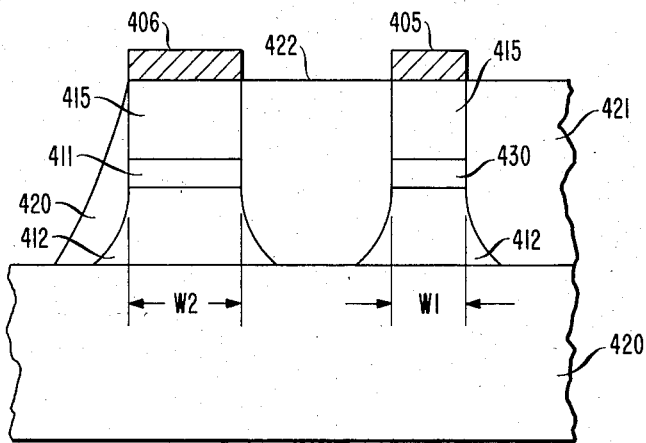
FIG. 12 shows, in pictorial form, an enlarged view of a portion of the cross section shown in FIG. 11.

FIG. 10 shows a top view and FIG. 11 shows a vertical slice along the direction shown by arrows 400 of an injection laser structure in which coupling between active portions of two transmission lines is provided. FIG. 12 is an enlargement of a portion of FIG. 11. Mirrors 401 and 402 in FIG. 10 are broadband mirrors and form a laser cavity. Arrows 403 and 404 show the direction of laser radiation which emerges from the structure. Metal contacts 405 and 406 and bottom electrode 410, all shown in FIG. 11, are used to separately inject current into the active laser waveguide section and the auxiliary light guiding section. Layers 412, 411 and 415 are grown on substrate 420. Layer 411 is an active laser material and layers 412 and 415 are cladding layers. Selective etchings, by means of techniques well known in the art, creates the two mesas which are disposed under metal contacts 405 and 406. Active laser waveguide 139 and auxiliary light guiding section 140 shown in FIG. 8 are formed in these two mesas. The mesas have widths W2 and W1, respectively, as shown in FIG. 12.

In the embodiment shown in FIG. 12, the index of refraction of the active region of both transmission lines, 411 and 430, is chosen to be the same, i.e., nA. This is not a necessary condition, but merely one example which results in a structure having the type of wavelength-variable phase constants shown by the curves in FIG. 9. Further, for illustrative purposes, layers 415, 412, 421 and 422 are all chosen to have the same index of refraction, nB, and the index of refraction of layer 420, nC, is chosen to be related to nA and nB in the following manner:

$$nC < nB < nA \tag{1}$$

In addition, width W2 is illustratively chosen to be greater than width W1. These choices result in the wavelength-variable phase constants shown in FIG. 13, as theoretically explained in an article entitled "Tunable Optical Waveguide Directional Coupler Filter" by R. C. Alferness and R. V. Schmidt in *Applied Physics Letters*, Vol. 33 No. 2, 15 July 1978, p. 161.

Figure 13:
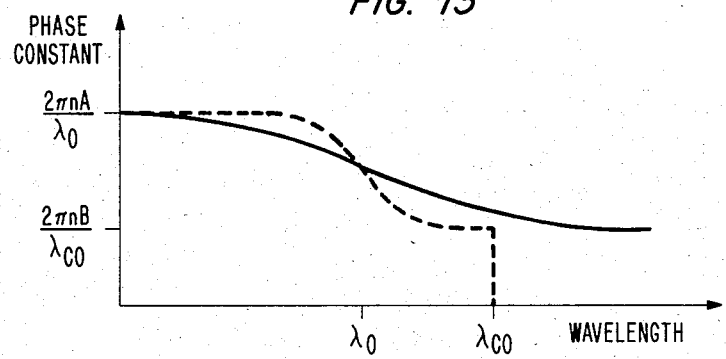
FIG. 13 shows, in graphical form, the relation between the phase constants of the active laser waveguide section and the auxiliary light guiding section provided by the structure shown in FIGS. 10–12.

Layers 412, 411, 430 and 415, all shown in FIG. 12, are fabricated from known alloys of InGaAsP and layer 420 may be $SiN_2$ or any other suitable material having the appropriate value of index of refraction. Widths W2 and W1 are chosen to give appropriate cross-over points of the phase constants at the operating wavelength of the structure, as shown in FIG. 13. For example, in the wavelength region of interest, widths W1 and W2 should be approximately equal to 1.0 and 1.5 microns, respectively. Further, in accordance with the principle of a cutoff in asymmetric waveguides illustrated in pp. 19-25 of *Integrated Optics*, edited by T. Tamir and published by Springer-Verlag, there will be no guiding in the mesa under contact 406 after the cutoff wavelength shown in FIG. 13.

Figure 14:
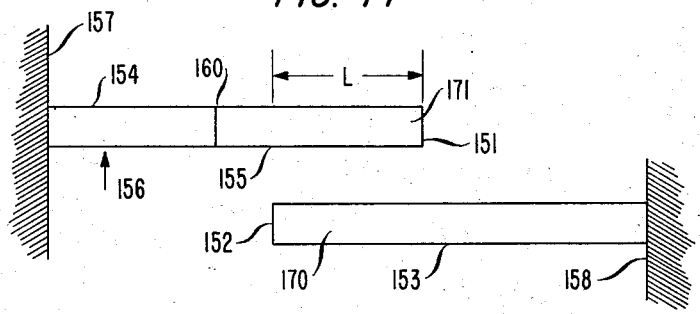
FIG. 14 shows, in pictorial form, an embodiment of the present invention which employs coupling between passive regions in two transmission lines.

FIG. 14 shows a further embodiment of the present invention which is similar to the embodiment shown in FIG. 8. Also, as in other figures, for the sake of clarity, only sufficient detail is shown to enable one skilled in the art to understand the operation of this embodiment. In particular, FIG. 14 shows a view looking down at the top of the injection laser structure. Here, distributed coupling is provided between the passive sections in the two waveguides. Specifically, transmission line 160 has active region 154 and passive region 155. Active region 154 is pumped by injection current as shown by arrow 156. Transmission line 153 is a passive region. Both transmission lines 153 and 160 have lossy terminations, 151 and 152 respectively. Broadband mirrors 157 and 158 form a laser cavity. Transmission lines 153 and 160 are coupled to transfer energy in passive coupling regions 170 and 171 over a length L. Illustratively, passive coupling regions 170 and 171 can be fabricated from $LiNbO_3$. In a further aspect of this embodiment, passive coupling regions 170 and 171 can be subjected to a variable electric field, by means of voltages applied to electrodes deposited over passive regions 170 and 171, in order to utilize the electro-optic effect to tune the value of the main mode oscillation frequency. By so doing, a single active region can provide a single-mode-laser having a multiplicity of different output wavelengths. Furthermore, a high speed frequency modulated (FM) laser output is produced when an FM signal is fed into the lithium niobate coupling structure. Coupling between passive waveguide sections using LiNbO₃ has been disclosed to the art in the above-mentioned Alferness and Schmidt article. Furthermore, the wavelength selective passive regions 153 and/or 155 may be fabricated from fused silica in order to provide excellent stability against temperature variations.

Furthermore, lossy termination 151 in transmission line 160 may easily be achieved by not injecting current into region 155 in an otherwise continuous structure 160. Clearly, many other varied embodiments may be constructed by those skilled in the art without departing from the spirit and scope of the present invention.

What is claimed is:

1. An injection laser which comprises:
   a laser cavity having a main mode,
   an active laser region disposed within the laser cavity,
   means for injection pumping the active laser region to produce laser radiation, and
   auxiliary light guiding means disposed in a physical relationship with said active laser region so that laser radiation is coupled therebetween in order to provide a wavelength selective energy loss in said active laser region, wherein a value of loss at the wavelength of the main mode is less than its value at the wavelengh of modes other than the main mode.

2. An injection laser which comprises:
   an active laser region having a first end which is a partial reflector of laser radiation generated in the active laser region,
   a laser partial reflector of laser radiation disposed to form a laser cavity with the first end, the laser cavity having a main mode,
   means for injection pumping the active laser region to produce laser radiation, and
   auxiliary light guiding means disposed in a physical relationship with said active laser region so that laser radiation is coupled therebetween in order to provide a wavelength selective energy loss in said active laser region, wherein a value of loss at the wavelength of the main mode is less than its value at the wavelength of modes other than the main mode.

3. An injection laser which comprises:
   an active laser region having a first end and a second end which form a laser cavity having a main mode,
   means for injection pumping the active laser region to produce laser radiation, and
   auxiliary light guiding means disposed in a physical relationship with said active laser region so that laser radiation is coupled therebetween in order to provide a wavelength selective energy loss in said active laser region, wherein a value of loss at the wavelength of the main mode is less than its value at the wavelength of modes other than the main mode.

4. The injection laser of claims 1,2 or 3 wherein the loss of energy has a value at the wavelength of the main mode that is less than 10% less than its value at the wavelengths of modes other than the main mode.

5. The injection laser of claim 1, 2, or 3 wherein the auxiliary light guiding means is a waveguide.

6. The injection laser claimed in accordance with claim 5 wherein the waveguide has an active gain region and wherein the injection laser further comprises means for injection pumping the active gain region in the waveguide.

7. The injection laser claimed in accordance with claim 6 wherein the gain of the waveguide is higher than the gain, of the active laser region.

8. The injection laser claimed in accordance with claim 7 wherein the waveguide has lossy terminations for the laser radiation.

9. The injection laser claimed in accordance with claim 8 wherein the coupling between the active laser region and the waveguide is periodic.

10. An injection laser which comprises:
    an active laser region having a first end which is a partial reflector of laser radiation generated in the active laser region, and a second end,
    means for injection pumping the active laser region to produce the laser radiation,
    an auxiliary light guiding section having a first end and a second end, the second end being a partial reflector of the laser radiation,
    means for providing gain in said auxiliary guiding section, the auxiliary light guiding section being disposed so that a laser cavity having a main mode is formed between the first end of the active laser region and the second end of the auxiliary light guiding section, and wherein the active laser region and the auxiliary light guiding section are disposed so that laser radiation is coupled therebetween in order to provide a wavelength selective energy loss, wherein a value of loss at the wavelength of the main mode is less than its value at the wavelengths of modes other than the main mode.

11. An injection laser which comprises:
    an active laser region having a first end which is a partial reflector of laser radiation generated in the active laser region, and a second end,
    means for injection pumping the active laser region to produce the laser radiation,
    a laser partial reflector of the laser radiation,
    an auxiliary light guiding section having a first end and a second end, the laser partial reflector being disposed to reflect radiation from the second end of the auxiliary light guiding section so that a laser cavity having a main mode is formed between the first end of the active laser region and the laser partial reflector,
    means for providing gain in the auxiliary light guiding section, the active laser region and the auxiliary light guiding section being disposed so that laser radiation is coupled therebetween in order to provide a wavelength selective energy loss, wherein a value of loss at the wavelength of the main mode is less than its value at the wavelengths of modes other than the main mode.

12. An injection laser which comprises:
    an active laser region having a first end and a second end,
    means for injection pumping the active laser region to produce laser radiation,
    a first and a second partial reflector of the laser radiation generated in the active laser region,
    an auxiliary light guiding section having a first end and a second end, the second partial reflector being disposed to reflect radiation from the second end of the auxiliary light guiding section and the first partial reflector being disposed to reflect radiation from the first end of the active laser region so that a laser cavity having a main mode is formed between the first and the second partial reflectors, means for providing gain in the auxiliary light guiding section, the active laser region and the auxiliary light guiding section being disposed so that laser radiation is coupled therebetween in order to provide a wavelength selective energy loss, wherein a value of loss at the wavelength of the main mode is less than its value at the wavelengths of modes other than the main mode.

13. The injection laser claimed in accordance with claims 10, 11 or 12 wherein the first end of the auxiliary light guiding section and the second end of the active laser region are lossy terminations for the laser radiation.

14. The injection laser claimed in accordance with claim 13 wherein the phase constants of the active laser region and the auxiliary light guiding section are equal at only one value of wavelength.

15. The injection laser claimed in accordance with claim 14 wherein the active laser region and the auxiliary light guiding section have different widths and indexes of refraction.

16. An injection laser which comprises:
a first transmission waveguide having first and second ends, an active laser region and a passive region, wherein the first end is a partial reflector of laser radiation generated in the active laser region, means for injection pumping the active laser region to produce the laser radiation, an auxiliary light guiding section having a passive region, a first and second ends, the second end of the auxiliary light guiding section being a partial reflector of the laser radiation, wherein the auxiliary light guiding section is disposed so that a laser cavity having a main mode is formed between the first end of the first transmission waveguide and the second end of the auxiliary light guiding section, and wherein the first transmission waveguide and the auxiliary light guiding section are disposed so that laser radiation is coupled between the passive regions of each in order to provide a wavelength selective loss of energy, wherein a value of loss at the wavelength of the main mode is less than its value at the wavelengths of modes other than the main mode.

17. An injection laser which comprises;
a first transmission waveguide having an active laser region and a passive region, the first transmission waveguide having first and second ends which are partial reflectors of laser radiation generated in the active laser region, means for injection pumping the active laser region to produce the laser radiation, a laser partial reflector of the laser radiation, an auxiliary light guiding section having a passive region, a first end and a second end, wherein the laser partial reflector is disposed to reflect radiation from the second end of the auxiliary light guiding section so that a laser cavity having a main mode is formed between the first end of the first transmission waveguide and the first partial reflector, and wherein the first transmission waveguide and the auxiliary light guiding section are disposed so that laser radiation is coupled between the passive regions of each in order to provide a wavelength selective energy loss, wherein a value of loss at the wavelength of the main mode is less than its value at the wavelengths of modes other than the main mode.

18. An injection laser which comprises:
a first transmission waveguide having an active laser region and a passive region, the first transmission waveguide having first and second ends, means for injection pumping the active laser region to produce laser radiation, a first and a second partial reflector of the laser radiation generated in the active laser region, an auxiliary light guiding section having first and second ends, the second partial reflector being disposed to reflect radiation from the second end of the auxiliary light guiding section and the first partial reflector being disposed to reflect radiation from the first end of the first transmission waveguide so that a laser cavity having a main mode is formed between the first and the second partial reflectors, wherein the first transmission waveguide and the auxiliary light guiding section are disposed so that laser radiation is coupled between the passive regions of each in order to provide a wavelength selective energy loss, wherein a value of loss at the wavelength of the main mode is less than its value at the wavelengths of modes other than the main mode.

19. The injection laser claimed in accordance with claims 16, 17 or 18 wherein the first end of the auxiliary light guiding section and the second end of the first transmission waveguide are lossy terminations for the laser radiation.

20. The injection laser claimed in accordance with claims 16, 17 or 18 wherein the passive waveguide regions are $LiNbO_3$ layers.

21. The injection laser claimed in accordance with claim 20 which further comprises metal electrodes disposed across the passive regions and a variable source of voltage applied across the electrodes whereby the phase constants and the coupling between the passive regions may be varied.

22. The injection laser claimed in accordance with claims 10, 11, 12, 16, 17 or 18 wherein the value of the loss of energy at the wavelength of the main mode is less than 10% less than its value at the wavelengths of modes other than the main mode.

* * * * *